US011056586B2

(12) United States Patent
Arthur et al.

(10) Patent No.: US 11,056,586 B2
(45) Date of Patent: Jul. 6, 2021

(54) TECHNIQUES FOR FABRICATING CHARGE BALANCED (CB) TRENCH-METAL-OXIDE-SEMICONDUCTOR FIELD-EFFECT TRANSISTOR (MOSFET) DEVICES

(71) Applicant: General Electric Company, Schenectady, NY (US)

(72) Inventors: Stephen Daley Arthur, Glenville, NY (US); Alexander Viktorovich Bolotnikov, Niskayuna, NY (US); Reza Ghandi, Niskayuna, NY (US); David Alan Lilienfeld, Niskayuna, NY (US); Peter Almern Losee, Clifton Park, NY (US)

(73) Assignee: GENERAL ELECTRIC COMPANY, Niskayuna, NY (US)

(*) Notice: Subject to any disclaimer, the term of this patent is extended or adjusted under 35 U.S.C. 154(b) by 0 days.

(21) Appl. No.: 16/147,216

(22) Filed: Sep. 28, 2018

(65) Prior Publication Data
US 2020/0105925 A1 Apr. 2, 2020

(51) Int. Cl.
*H01L 29/78* (2006.01)
*H01L 29/10* (2006.01)
(Continued)

(52) U.S. Cl.
CPC ...... *H01L 29/7813* (2013.01); *H01L 21/0465* (2013.01); *H01L 29/0865* (2013.01);
(Continued)

(58) Field of Classification Search
CPC ............ H01L 29/66734; H01L 29/7813
See application file for complete search history.

(56) References Cited

U.S. PATENT DOCUMENTS 6,444,528 B1    9/2002  Murphy
7,012,005 B2    3/2006  Lichtenberger et al.
(Continued)

FOREIGN PATENT DOCUMENTS

CN    104576335 A    4/2015
JP    2003248293 A   9/2003

OTHER PUBLICATIONS

Baliga, "Silicon Carbide Power Devices", World Scientific Publishing, Section 10.1.3, pp. 267-270, 2005.
(Continued)

*Primary Examiner* — Abul Kalam
(74) *Attorney, Agent, or Firm* — Fletcher Yoder, P.C.

(57) ABSTRACT

A charge balanced (CB) trench-metal-oxide-semiconductor field-effect transistor (MOSFET) device may include a charge balanced (CB) layer defined within a first epitaxial (epi) layer that has a first conductivity type. The CB layer may include charge balanced (CB) regions that has a second conductivity type. The CB trench-MOSFET device may include a device layer defined in a second epi layer and having the first conductivity type, where the device layer is disposed on the CB layer. The device layer may include a source region, a base region, a trench feature, and a shield region having the second conductivity type disposed at a bottom surface of the trench feature. The device layer may also include a charge balanced (CB) bus region having the second conductivity type that extends between and electrically couples the CB regions of the CB layer to at least one region of the device layer having the second conductivity type.

21 Claims, 14 Drawing Sheets

(51) Int. Cl.
*H01L 29/66* (2006.01)
*H01L 29/16* (2006.01)
*H01L 21/04* (2006.01)
*H01L 29/08* (2006.01)

(52) U.S. Cl.
CPC ...... *H01L 29/1095* (2013.01); *H01L 29/1608* (2013.01); *H01L 29/66734* (2013.01)

(56) References Cited

U.S. PATENT DOCUMENTS

| | | | |
|---|---|---|---|
| 7,768,066 B2 | 8/2010 | Onose et al. | |
| 8,105,927 B2 | 1/2012 | Nonaka et al. | |
| 8,258,052 B2 | 9/2012 | Okuno et al. | |
| 8,357,971 B2 | 1/2013 | Peake et al. | |
| 8,546,258 B2 | 1/2013 | Kim et al. | |
| 9,704,949 B1 | 7/2017 | Ghandi et al. | |
| 9,735,237 B2 | 8/2017 | Losee et al. | |
| 9,761,702 B2 * | 9/2017 | Zeng | H01L 29/7812 |
| 9,768,259 B2 | 9/2017 | Suvorov et al. | |
| 9,893,176 B2 | 2/2018 | Konstantinov | |
| 10,157,983 B2 * | 12/2018 | Zeng | H01L 29/7397 |
| 2006/0276014 A1 | 12/2006 | Hsu et al. | |
| 2008/0014693 A1 | 1/2008 | Matocha | |
| 2010/0308400 A1 | 12/2010 | Darwish et al. | |
| 2011/0180843 A1 | 7/2011 | Russo et al. | |
| 2012/0248530 A1 | 10/2012 | Lui et al. | |
| 2015/0348784 A1 | 12/2015 | Granahan | |
| 2016/0359029 A1 * | 12/2016 | Zeng | H01L 29/404 |
| 2017/0278924 A1 | 9/2017 | Bolotnikov et al. | |
| 2017/0365683 A1 * | 12/2017 | Blanchard | H01L 29/66734 |
| 2018/0019304 A1 * | 1/2018 | Mauder | H01L 29/0619 |
| 2018/0166531 A1 | 6/2018 | Bolotnikov et al. | |
| 2018/0197948 A1 * | 7/2018 | Hsieh | H01L 29/0638 |
| 2018/0248002 A1 * | 8/2018 | Kawada | H01L 21/0475 |
| 2018/0261666 A1 * | 9/2018 | Zeng | H01L 29/7802 |

OTHER PUBLICATIONS

Holland, O.W., et al.; "A Method to Improve Activation of Implanted Dopants in Sic", vol. 650 (Symposium R—Microstructural Processes in Irradiated Materials—2000), Mar. 21, 2011.

Rohm Co., Ltd., "New Products Under Development 3rd Geb SiC MOSFET", 2014, 10 pages.

Peters et al., "Performance and Ruggedness of 1200V Sic—Trench—MOSFET", 29th International Symposium on Power Semiconductor Devices and IC's (ISPSD), Jul. 24, 2017, 4 pages.

Wang, Shou Guo; "Fabrication and Characteristics of Ion-implanted 4H Silicon Carbide Metal-Semiconductor Field-Effect Transistors on a P-Type Epilayer", Chinese Journal of Physics, vol. 51, Issue: 2, Apr. 2013.

Oraon, Alisha, et al.; "A double trench 4H—SiC MOSFET as an enhanced model of SiC UMOSFET", 2017 7th International Symposium on Embedded Computing and System Design (ISED), Durgapur, India, pp. 1-5, Dec. 2017.

Bharti, Deepsikha, et al.; "Optimization of SiC UMOSFET Structure for Improvement of Breakdown Voltage and ON-Resistance", IEEE Transactions on Electron Devices, vol. 65, Issue: 2, pp. 615-621, Feb. 2018.

International Search Report; Written Opinion; PCT/US2019/052484 dated Jan. 10, 2020; 14 pages.

* cited by examiner

TECHNIQUES FOR FABRICATING CHARGE BALANCED (CB) TRENCH-METAL-OXIDE-SEMICONDUCTOR FIELD-EFFECT TRANSISTOR (MOSFET) DEVICES

BACKGROUND

The subject matter disclosed herein relates to semiconductor power devices and, more specifically, to systems for providing charge balance (CB) semiconductor power devices.

For semiconductor power devices, charge balance (CB) designs offer several advantages. For example, CB devices demonstrate reduced resistance and reduced conduction losses per unit area relative to traditional unipolar device designs. However, the switching speed of CB devices utilizing floating CB regions depends on the recombination-generation rates of the carriers in the semiconductor material. For some semiconductor materials, such as wide band gap materials, the recombination-generation rates may be relatively low and may cause relatively low switching speeds. These floating CB regions may improve switching speeds, however, a floating CB region may be unpredictable. For example, it may be difficult to determine or measure a potential (e.g., voltage level) associated with a floating CB region, which can result in irregularity and/or unpredictability during device operation.

BRIEF DESCRIPTION

A charge balanced (CB) trench-metal-oxide-semiconductor (MOS) device may include a charge balanced (CB) layer defined within a first epitaxial (epi) layer having a first conductivity type. The CB layer includes a plurality of charge balanced (CB) regions having a second conductivity type. The CB trench-MOS device also includes a device layer defined in a second epi layer having the first conductivity type disposed on the CB layer. The device layer may include a source region having the first conductivity type disposed at an upper surface of the second epi layer and a base region having the second conductivity type disposed below the source region. The device layer may also include a trench feature that at least partially extends from the upper surface of the second epi layer to a depth below the base region. In addition, the device layer may include a shield region having the second conductivity type disposed at a bottom surface of the trench feature and a charge balanced (CB) bus region having the second conductivity type that extends between and electrically couples the CB regions of the CB layer to at least one region of the device layer having the second conductivity type.

A method of manufacturing a charge balanced (CB) trench-metal-oxide-semiconductor (MOS) device may include forming a charge balanced (CB) layer from a first epitaxial (epi) layer having a first conductivity type by implanting charge balanced (CB) regions within the first epi layer. The method may also include forming a device layer from a second epi layer disposed on the CB layer and forming a high-energy implantation mask above the device layer. The method may also include performing an implantation to form a charge balanced (CB) bus region having a second conductivity type and having a depth to extend into portions of the device and CB layer, wherein the CB bus region electrically couples the CB regions to a region of the device layer having the second conductivity type.

A system may include a charge balanced (CB) trench-MOSFET device. The CB trench-MOSFET device may include a charge balanced (CB) layer defined within a first epitaxial (epi) layer having a first conductivity type. The CB layer may include two or more charge balanced (CB) regions having a second conductivity type. The CB trench-MOSFET device may also include a device layer defined in a second epi layer disposed on the CB layer. The system may also include an active area including the CB trench-MOSFET device and an overhead area having a second conductivity type disposed adjacent to the active area. The system may also include a charge balanced (CB) bus region having the second conductivity type that extends between and electrically couples the plurality of CB regions of the CB layer to the source contact via a region of the device layer having the second conductivity type, wherein the CB bus region is disposed within the active area and/or the overhead area.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
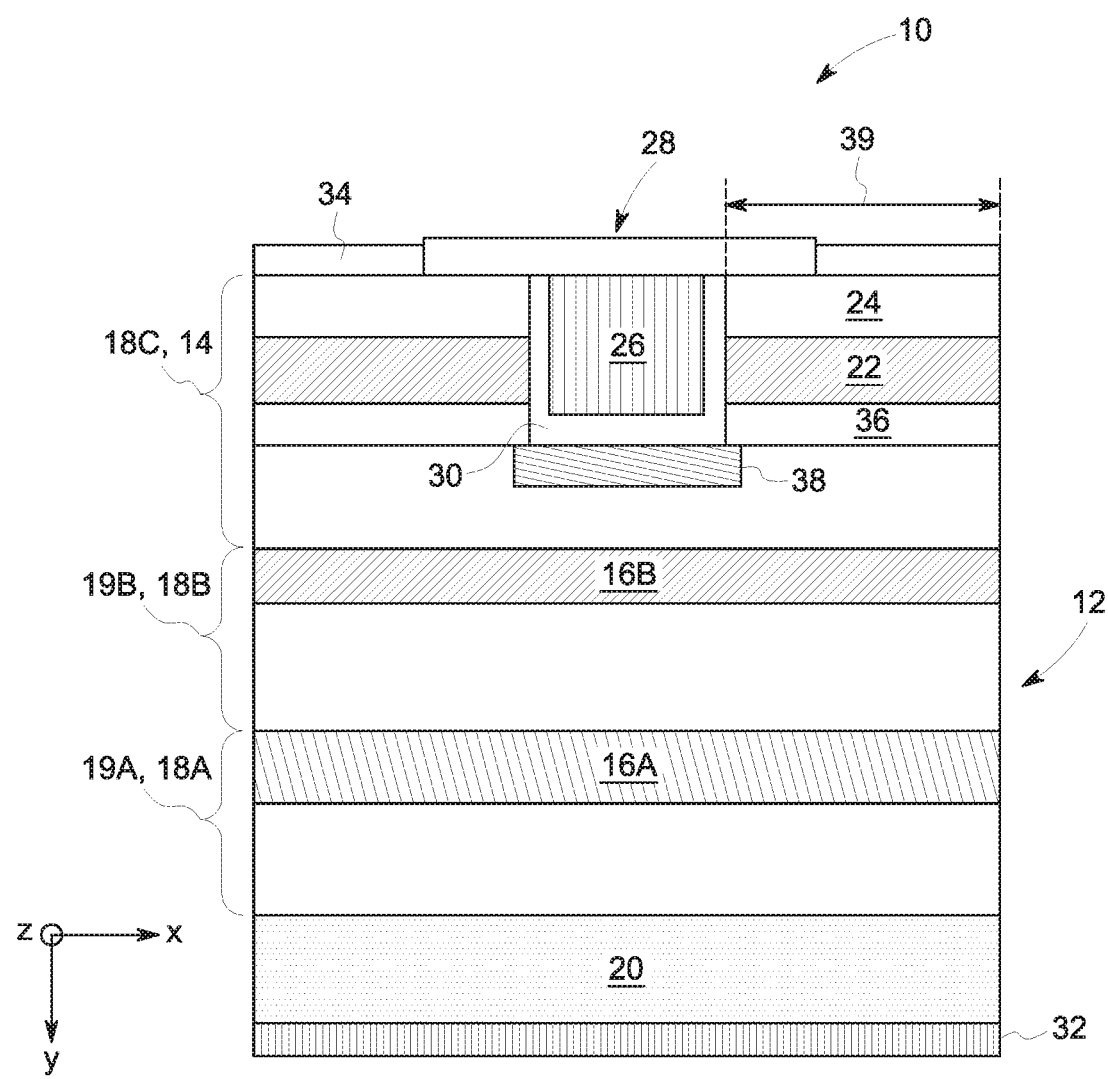
FIG. 1 is a cross-sectional view of a charge balanced (CB) trench-metal-oxide-semiconductor field-effect transistor (MOSFET) device that includes CB regions, in accordance with embodiments of the present approach.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers or features are directly in contact with each other with no intervening layers or features there between. The term "adjacent" as used herein means that the two layers are disposed contiguously and are in direct contact with each other.

In the present disclosure, when a layer/region is described as "on" another layer or substrate, it is to be understood that the layers/regions may either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer.

Present embodiments are directed toward designs and methods of manufacturing semiconductor devices, such as semiconductor charge-balance (CB) devices or semiconductor super-junction (SJ) devices. The disclosed designs and methods are useful in the manufacture of CB devices, such as vertical CB trench metal-oxide semiconductor field-effect transistor (MOSFET) devices, as well as other devices that may be useful for medium-voltage (e.g., 2 kV-10 kV) and high-voltage (e.g., greater than or equal to 10 kV or 10 kV-20 kV) power conversion related applications. While discussed in the context of a vertical CB trench-MOSFET device below, it may be appreciated that the disclosed technique may be applicable to other suitable types of semiconductor devices, such as vertical channel junction field-effect transistors (JFETs), horizontal channel JFETs, vertical channel metal-semiconductor field-effect transistors (MESFETs). Additionally, while discussed below in the context of implanting silicon carbide (SiC) layer, the disclosed methods may be useful when performing high-energy implantation processes on materials, such as gallium nitride, diamond, aluminum nitride, boron nitride, or other suitable wide-bandgap semiconductor materials.

As discussed below, the disclosed CB devices include multi-layered drift regions implemented using repeated epitaxial growth and dopant ion implantation steps. As used herein, the term "multi-layered," as well as references to a particular number of layers (e.g., "two-layered," "three-layered," "four-layered,"), may refer to the number of epitaxial (epi) layers of the CB device. The disclosed multi-layered drift region designs include charge balanced (CB) layers having a first conductivity type (e.g., n-type CB layers). Further, each of these CB layers includes a plurality of charge balanced (CB) regions, which are discrete, buried, implanted regions of doping having the opposite conductivity type as the remainder of the CB layer and that reshape the electrical field in the active area of a CB device. These CB regions are described herein as "buried" in that they are disposed within the lower epi layers (e.g., within a CB layer that is disposed between the upper/device epi layer and the substrate layer) of the CB device. For the disclosed CB device embodiments, as discussed below, these CB layer designs enable low conduction losses and high blocking voltages while still maintaining a relatively simple fabrication process.

Further, as discussed below, the disclosed CB devices include CB bus regions of the same conductivity type as the CB regions, and the CB bus regions generally provide an electrical connection (e.g., a vertical connection) between the CB regions of the CB layers and a doped region (e.g., a top region, a second conductivity region, a well region, body contact region, a body region, or termination region) of the same conductivity type as the CB regions that is disposed at or proximate to a upper surface (e.g., the epi layer furthest from the substrate layer) of the device. It is presently recognized that fast switching speeds and high blocking voltages may be achieved using CB bus regions having a sufficient depth to reach and contact the CB regions. As such, when the CB device transitions from an off-state to on-state, carriers are able to flow directly from the doped region(s) to the CB regions via CB bus regions. Conversely, during a transition from on-state to off-state, carriers are able to flow directly from the CB regions to the source/body terminal via the CB bus regions. As a result, the switching performance of disclosed CB devices is independent of the recombination-generation rates of the carriers, thereby offering increased switching speeds and reduced switching and dynamic on-resistance losses compared to CB devices with floating CB regions having the same current/voltage rating, without substantially increasing the leakage current.

FIG. 1 is a cross-sectional view of an embodiment of a vertical CB trench-MOSFET device 10 includes a drift region 12 and a device layer 14 disposed on a number of charge balanced (CB) regions 16 (e.g., CB region 16A, CB region 16B). A CB trench-MOSFET device 10 may have a distributed potential difference within the drift region 12 of the CB trench-MOSFET device 10, causing a decrease in a maximum electric field within the device. It may be appreciated that, to more clearly illustrate certain components of the CB trench-MOSFET device 10, as well as other devices discussed below, certain commonly understood design elements (e.g., top metallization, passivation, edge termination, and so forth) may be omitted. It should also be appreciated that the various layers and features illustrated in the figures of this disclosure are not drawn to scale.

As discussed below, the CB trench-MOSFET device 10 illustrated in FIG. 1 includes a number of epitaxial (epi) layers 18 (e.g., epi layer 18A, epi layer 18B, epi layer 18C) having a first conductivity type (e.g., n-type or p-type) that form the device layer 14 and the CB layers 19 (e.g., CB layer 19A, CB layer 19B) of the CB trench-MOSFET device 10. Additionally, the epi layers 18 each have an epi dopant concentration which, in certain embodiments, may be the same or different. While the illustrated embodiment includes three epi layers 18, it should be understood that the CB trench-MOSFET device 10 may include any suitable number of epi layers 18 (e.g., two, four, five, six, or more), including any suitable number of CB layers 19, to yield a CB trench-MOSFET device 10 having a particular desired voltage rating. In some embodiments, the epi layers 18 may be formed from one or more wide band gap semiconductor materials, such as silicon carbide (SiC), gallium nitride, diamond, aluminum nitride, and/or boron nitride. Semiconductor devices implementing SiC epi layers 18 may have particular improvements, including improved thermal stability, lower on-state resistance (Rds(on)), higher breakdown voltages, and improved switching performance at least in comparison to semiconductor devices formed from other materials. Regardless of the material, epi layers 18 may be fabricated using repeated cycles of epitaxial overgrowth. For the embodiment as illustrated, a first epi layer 18A is disposed directly on a substrate 20, a second epi layer 18B is disposed directly on the first epi layer 18A, and a third epi layer 18C is disposed directly on the second epi layer 18B.

The device layer 14 of the illustrated CB trench-MOSFET device 10 includes a base region 22 having a second conductivity type (e.g., opposite the first conductivity type, the epi doping of the epi layer 18C) and disposed directly below a source region 24 having the first conductivity type. A gate 26 (e.g., a polysilicon gate) is disposed within a trench feature 28A and is suitably electrically isolated from the device layer 14 by an oxide 30 (e.g., $SiO_2$). In certain embodiments, the oxide 30 may be fabricated to be thicker on the bottom than on the sidewalls. In addition, the sidewalls may be fabricated to be straight, or sustainably perpendicular to a major flat of the substrate 20 such that crystalline structure mobility is more predictable and easier to design to maximize mobility along the sidewalls. Further, the CB trench-MOSFET device 10 includes the substrate 20 (e.g., semiconductor substrate layer, a wide band gap substrate layer) and a drain contact 32 (e.g., drain electrode, drain terminal) is disposed on the bottom of the CB trench-MOSFET device 10 directly on a lower surface of the substrate 20. Additionally, a source contact 34 (e.g., source electrode, source terminal) is disposed directly on the source region 24. The device layer 14 also includes an optional enhanced doping region 36 having the first conductivity type at a concentration substantially greater than the epi doping of the epi layer 18C. For example, the optional enhanced doping region 36 may have a dopant ion concentration of approximately $1\times10^{17}$ per centimeters cubed ($cm^{-3}$) and the epi doping of the epi layer 18C may an epi dopant ion concentration of approximately $1\times10^{16}$ $cm^{-3}$. The enhanced doping region 36 is included to aid current flow toward the drain contact 32 from the source contact 34. In this way, the enhanced doping region 36 diffuses electrons around a shield region 38 (e.g., across mesa width 39 in the direction of the X-axis) and down towards the drain contact 32 (e.g., vertically toward the drain contact 32), helping to avoid channel pinch-off while the CB trench-MOSFET device 10 is in the active state. Having the shield region 38 facilitates protecting the oxide 30 from high electric fields present while the CB trench-MOSFET device 10 is blocking. In addition, the shield region 38 is used in SiC CB trench-MOSFET devices because the electric fields present in SiC are generally ten times greater than the electrics fields present in silicon epi layers 18. The dopant ion concentration of the shield region 38 may be formed using an implantation dose of approximately $3.0\times10^{13}$ per square centimeters ($cm^{-2}$).

During on-state operation, a suitable gate voltage (e.g., at or above a threshold voltage (Vth) of the CB trench-MOSFET device 10) permits current to flow from the drain contact 32 to the source contact 34. As described earlier, the CB trench-MOSFET device 10 includes two CB layers 19 (e.g., CB layer 19A, CB layer 19B) that each include CB regions 16 (e.g., CB region 16A, CB region 16B). These CB regions 16 are oppositely doped relative to the remainder of the CB layers 42 (e.g., relative the epi doping of the CB layer 42). For example, when a CB trench-MOSFET device 10 has n-type epi layers 18A, 18B, the CB regions 16 are p-type, and for CB trench-MOSFET devices 10 having p-type epi layers 18A, 18B, the corresponding CB regions 16 are n-type. Further, the dopant ion concentrations in the different CB layers 19 may be the same or different. It should be appreciated that the CB regions 16 are electrically coupled to each other, the source region 24, and the shield region 38 through a charge balanced (CB) bus region which is not visible in the cross-section of FIG. 1, but is discussed in greater detail below. These CB regions 16 and the remaining portion of the CB layers 19 are each generally designed to substantially deplete to generally provide similar amounts (e.g., substantially equal amounts) of effective charge (e.g., per $cm^2$, normalized to device active area) from dopant ions under reverse bias. The illustrated charge balanced structure permits the CB trench-MOSFET device 10 to achieve high breakdown voltage and low on-state resistance, since the p-type semiconductor portions and the n-type semiconductor portions are both substantially depleted under nominal blocking conditions.

Figure 2:
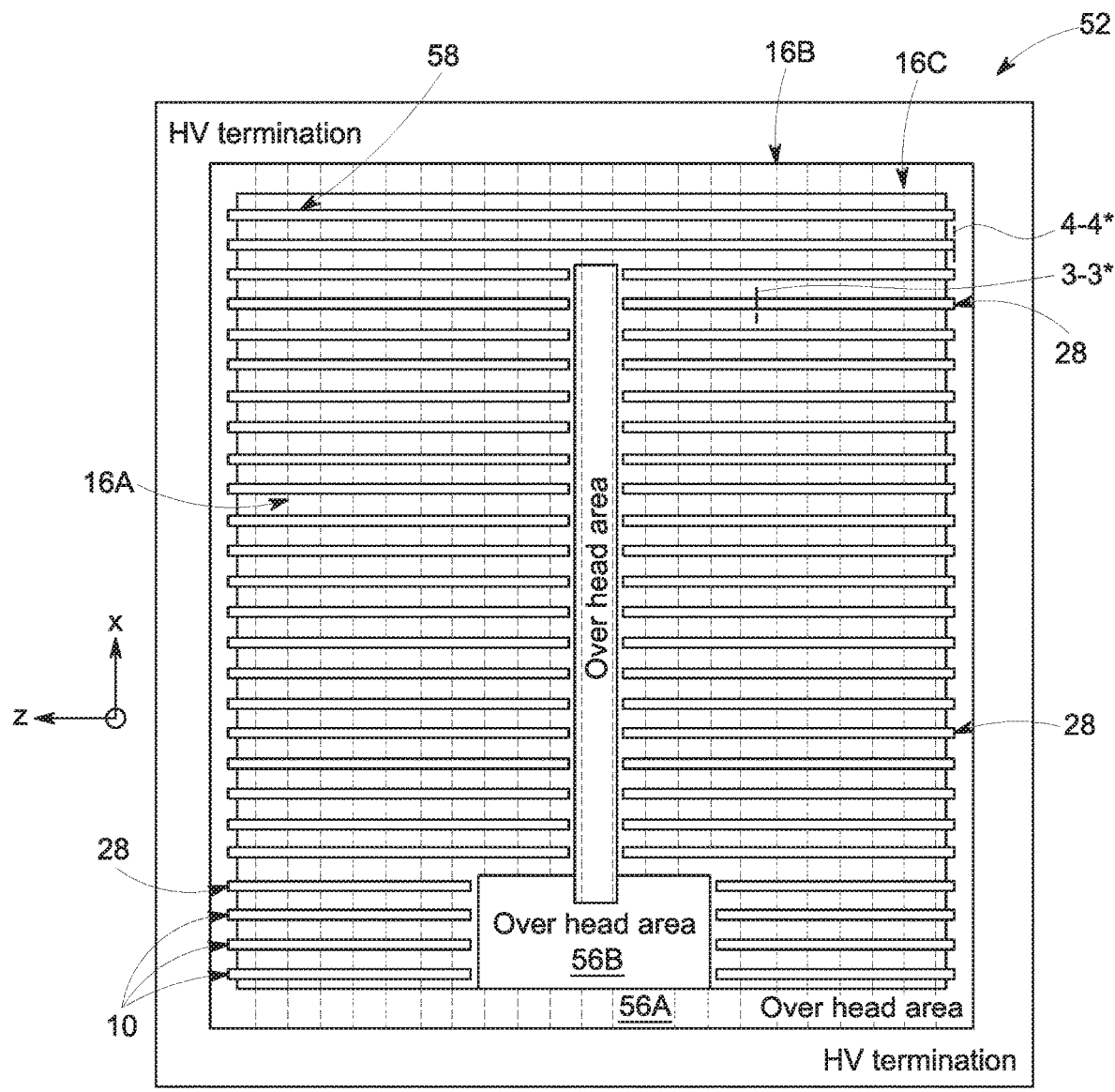
FIG. 2 is a plan view of a semiconductor device array that includes multiple of the CB trench-MOSFET devices of FIG. 1, in accordance with embodiments of the present approach.

FIG. 2 is a plan view or top-down view of an array 52 of multiple CB trench-MOSFET devices (e.g., CB trench-MOSFET device 10) including multiple areas where gate trenches are defined (e.g., multiples of the trench 28 formed to include the gate 26) and buried CB regions 16 (e.g., CB region 16A, CB region 16B, CB region 16C) that span the respective CB trench-MOSFET devices 10. Various additional components are illustrated that enable operation of the array 52 of CB trench-MOSFET devices 10, including a high voltage termination area 54, overhead areas 56 (e.g., overhead area 56A, overhead area 56B). These additional components are coupled to various portions of the CB trench-MOSFET devices to enable operation of the array 52 for power conversion applications. In certain embodiments, the buried CB regions 16 are electrically coupled to implanted regions (e.g., body regions, termination regions) having the second conductivity type that are disposed at the surface in overhead areas 56 and that are in ohmic contact with the source/body terminal. These connections may be formed through various embodiments of CB bus regions. For example, the overhead areas 56 may be designed to include one or more CB bus regions to connect the buried CB regions 16 to the source/body terminal of the system. As depicted, the buried CB regions 16 are orientated perpendicular, or substantially perpendicular to the gate trenches (e.g., trench 28). However it should be appreciated that the CB regions 16 may be orientated in any suitable direction relative to the gate trenches (e.g., trench 28).

Figure 3:
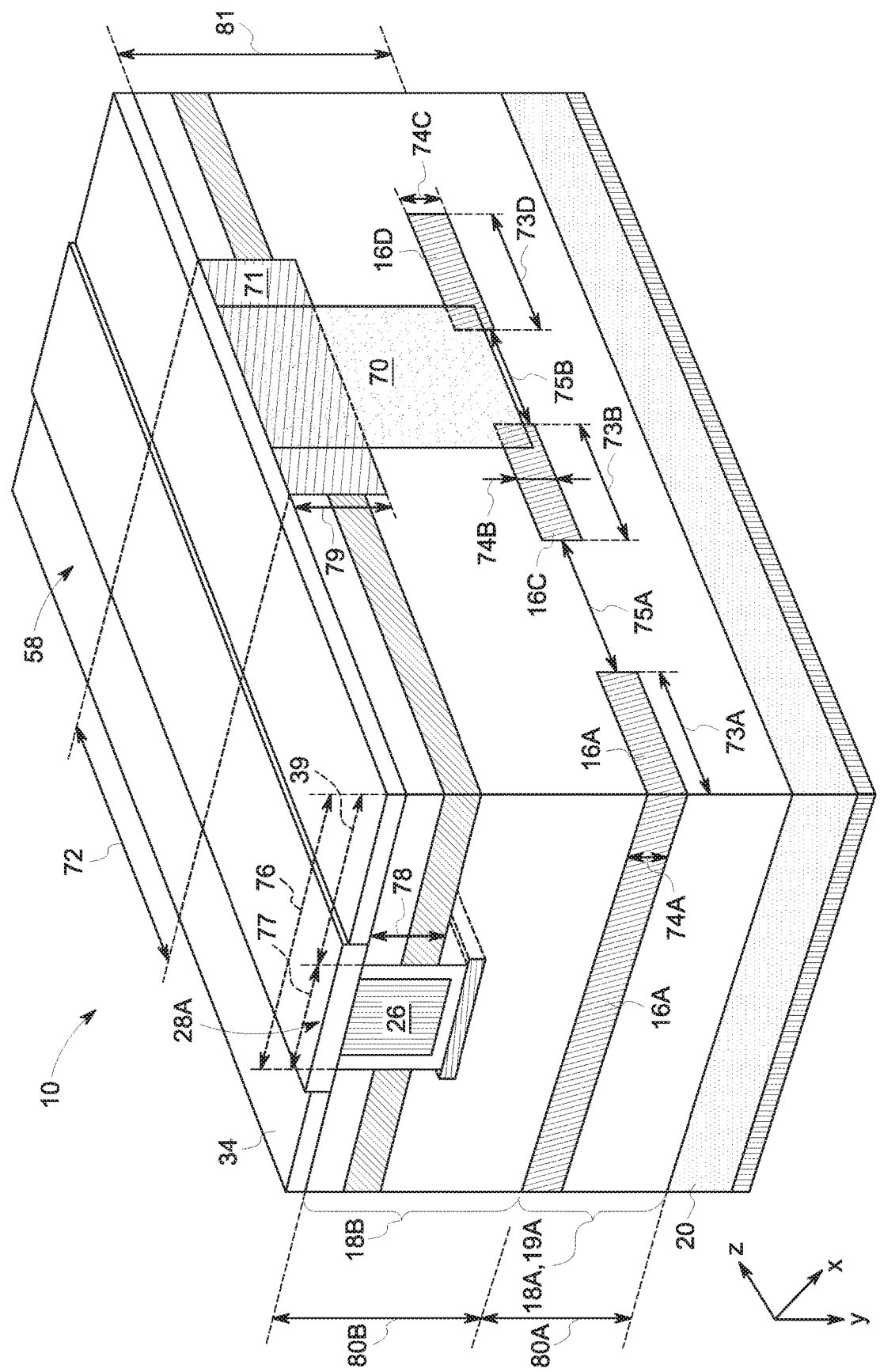
FIG. 3 is a perspective cross-sectional view of a CB trench-MOSFET device partially taken along line 3-3 of FIG. 2, in accordance with embodiments of the present approach.
Figure 4:
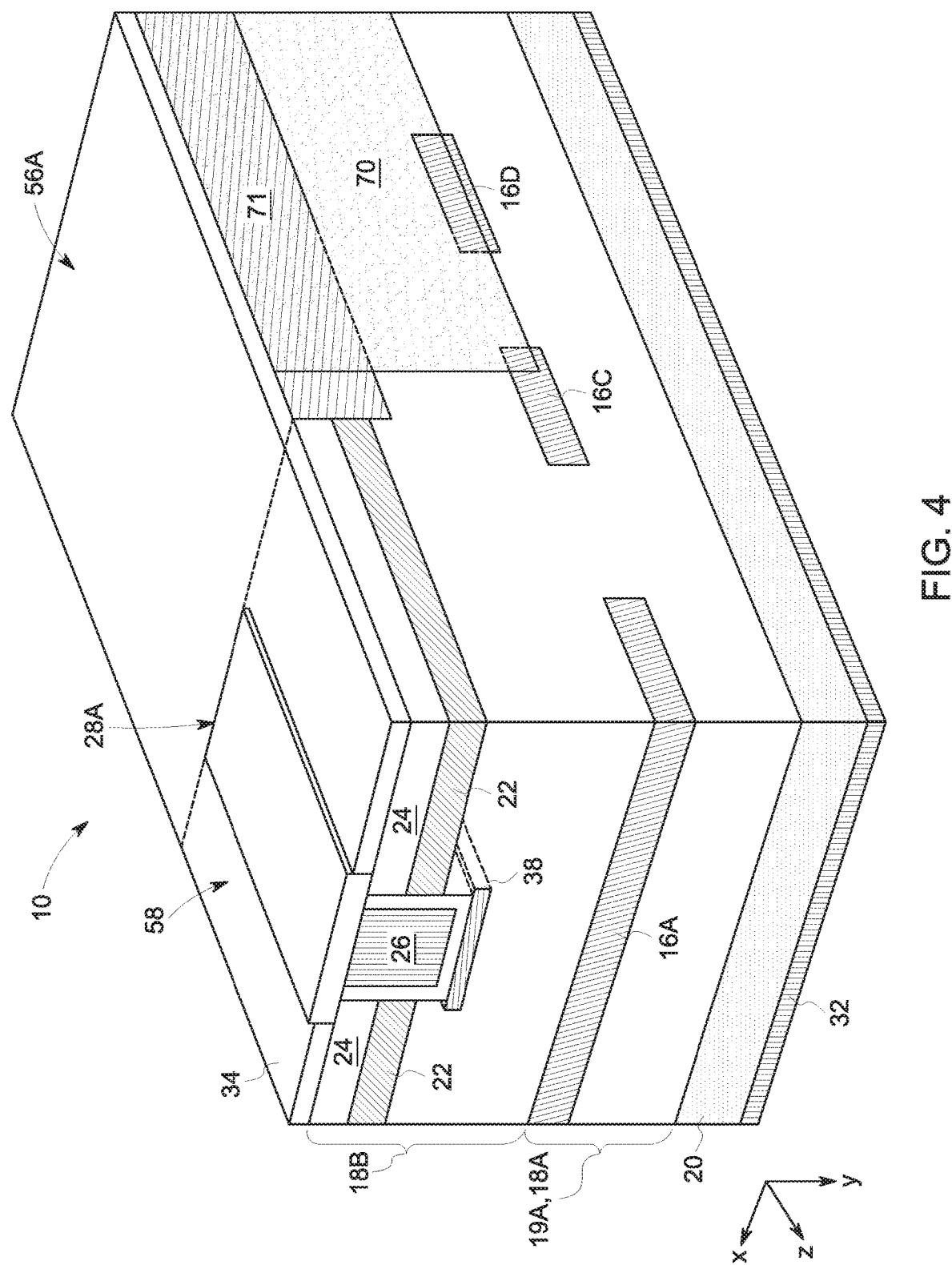
FIG. 4 is an additional perspective cross-sectional view of a CB trench-MOSFET device partially taken along line 4-4 of FIG. 2, in accordance with embodiments of the present approach.

FIG. 3 illustrates a perspective cross-sectional view partially taken along line 3-3 of a CB trench-MOSFET device 10 in an active area 58 of the array 52 of FIG. 2; while FIG. 4 illustrates a perspective cross-sectional view partially taken along line 4-4 of a CB trench-MOSFET device 10 near the overhead area 56A. It should be noted that CB bus regions depicted in both figures are merely examples, and, in some embodiments, the CB bus regions may be disposed at a same or different position than depicted in FIG. 3 or FIG. 4. In other words, the CB bus regions may take a variety of shapes and sizes to ensure that the various CB regions 16 are electrically coupled via the CB bus region to the body region 71 and/or a common potential of the CB trench-MOSFET device 10.

For the embodiment illustrated in FIG. 3, CB trench-MOSFET device 10 the illustrated portion of the CB trench-MOSFET device 10 includes a CB bus region 70 in addition to the trench feature 28A generally described in FIG. 2. The CB bus region 70 has the same conductivity type as the CB regions 16 and may be implanted into each of the epi layers 18 (e.g., epi layer 18B, epi layer 18A) using high-energy ion implantation. As depicted, the CB trench-MOSFET device 10 is an inversion mode trench-MOSFET with the CB regions 16 (e.g., CB region 16A, CB region 16C, CB region 16D) of the CB layer 19 electrically coupled to a body region 71 and at least partially electrically coupled to each other through the CB bus region 70. Here, high-energy ion implantation techniques are used to implant a conductive path having the second conductivity type into the CB trench-MOSFET device 10 active area to create the CB bus region 70. Thus, in this embodiment, the length 72 of the body region 71 (e.g., along Z-axis) is sufficient to accommodate any dimensional constraints of the high-energy ion implantation and narrow enough to be contained within a mesa width 39. This high-energy ion implantation facilitates the implanting of dopant ions at depths greater than 1 micrometers (μm) (e.g., 10 μm-12 μm).

Additionally, the CB regions 16 have particular lengths 73 (e.g., length 73A, length 73B, length 73D, each along Z-axis), for example, less than or equal to 1.5 μm or as small as is defined with current photolithography techniques. It should also be appreciated that lengths 73 of the CB regions 16 may vary between CB trench-MOSFET devices 10 and between CB layers 19. In different embodiments, the CB regions 16 may have different cross-sectional shapes (e.g., defined by implantation energies/doses). For some embodiments, the shape of the CB regions 16 may not substantially vary along the Y-axis. In addition, one or more CB regions 16 and/or one or more CB bus regions may be formed in the epi layer 18A along the Z-axis and/or the X-axis. That is, for example, the CB trench-MOSFET device 10 may include any suitable number of CB bus regions or CB regions 16. Additionally, with respect to dimensions, aspects of the CB trench-MOSFET devices 10, such as CB regions 16, trench features 28, CB regions 16, and the like, may respectively have a particular width (e.g., along the X-axis), depth or thickness (e.g., along the Y-axis), spacing (e.g., along the Z-axis), and length (e.g., along the Z-axis), and these respective dimensions may be suitably different between devices and/or layers based on application of the CB trench-MOSFET devices 10.

For example, to manufacture the embodiment of the CB trench-MOSFET device 10 illustrated in FIG. 3, the epi layer 18A may be formed on top of the substrate 20 using epitaxial growth techniques, and the CB regions 16 may be formed in the epi layer 18A using ion implantation to yield a first CB layer 19A. Further, an epi layer 18B may be formed directly on the epi layer 18A (e.g., along the Y-axis) using epitaxial growth techniques. It should be noted that the epitaxial growth/ion implantation steps may be repeated multiple (e.g., two, three, four, five, or more) times to yield a CB trench-MOSFET device 10 with any suitable number of CB layers 19. Additionally, the epi layer 18B (e.g., as the top layer of the epi layers 18) and may be suitably implanted with particular features to form the device layer 14 of the CB trench-MOSFET device 10.

Further, it should be appreciated that epi doping of the epi layers 18, doping concentrations of the CB regions 16, thicknesses 80 of the epi layers 18 (e.g., thickness 80A, thickness 80B), the lengths 73 of the CB regions 16 (e.g., length 73A, length 73B, length 73D), depths 74 (e.g., depth 74A, depth 74B, depth 74C) of the CB regions 16, and/or spacings 75 (e.g., spacing 75A, spacing 75B) between the CB regions 16 may be varied for different embodiments to enable desired electrical performance (e.g., desired blocking voltage) and particular CB layer 19A characteristics of the CB trench-MOSFET device 10. For example, in an embodiment the pitch 76 (e.g., trench width 77 plus mesa width 39) of the CB trench-MOSFET device 10 may be varied between 2.5 μm and 4.0 μm, a trench width 77 may be varied from 0.5 μm and 1.5 μm (e.g., 1 μm-1.5 μm), and the base region 22 implant depth 78 may be 0.9 μm and the body region 71 implant depth 79 may be 1.1 μm.

The CB bus regions may be fabricated by introducing dopant ions (e.g., boron, aluminum, nitrogen, phosphorus) into the epi layers 18 of the CB trench-MOSFET device 10 using high-energy ion implantation. A single CB bus region (e.g., CB bus region 70) may include a single implanted region or multiple implanted regions substantially aligned with one another across successive epi layers 18. In some embodiments, dopant ions may be implanted with implant acceleration energies of approximately 500 kiloelectron volts (KeV) to achieve a desired implantation depth 81. In the example of FIG. 3, the CB bus region 70 of the CB trench-MOSFET device 10 electrically couples to the body region 71 within the mesa width 39 to the CB region 16. Additionally, in certain embodiments, CB bus regions may be formed using high-energy ion implantation along with a suitable high energy mask (e.g., silicon on insulator (SOI), polysilicon, thick silicon oxide, high-Z metals such as platinum, molybdenum, gold). In particular, the high energy mask may be placed (e.g., formed, grown, deposited)

directly on an epi layer (e.g., to epi layer 18B) after epitaxial growth. The high-energy implantation mask may then mask a first portion of the upper surface of the device layer 14 and may selectively expose a second portion of the upper surface. Accordingly, the CB bus regions may be implanted into the exposed portion of the upper surface of the device layer 14. Further, in some embodiments, the CB bus regions may be at least partially implanted between the epi growth steps (e.g., implanted before or after the CB regions 16 are formed in the epi layer 18A and before the epi growth of the next epi layer 18B) such that a lower energy implant may be used to achieve a suitable depth.

As noted above, for the embodiment of FIG. 3, the CB bus region 70 decreases switching losses and increases switching speed by electrically coupling the CB regions 16 to the body region 71, the shield region 38 (discussed below in FIG. 7A and FIG. 7B although not clearly depicted in FIG. 3), and the base region 22. In particular, carriers from the source contact 34 and the body region 71 may flow directly to the CB regions 16 via the CB bus region 70 during transition of the CB trench-MOSFET device 10 from an off-state (e.g., blocking state) to an on-state (e.g., conducting state), and similarly, carriers from the CB regions 16 may flow directly to the source contact 34 and the body region 71 via the CB bus regions during transition of the CB trench-MOSFET device 10 from the on-state to the off-state.

As depicted in FIG. 3, the CB bus region 70 is formed within an active area 58 of the array 52. FIG. 4 depicts another embodiment of the CB bus region 70 that is formed within an overhead area 56A of the array 52 of FIG. 2. Although depicted as formed in the overhead area 56, it should be understood that the array 52 may include the CB bus region in the overhead area 56A, in the active area 58, and/or in a combination of the overhead area 56A and the active area 58. Continuing on to FIG. 4, FIG. 4 is a perspective cross-sectional view of the embodiment of the CB trench-MOSFET device 10, taken along line 4-4 of FIG. 2, to show a portion of the overhead area 56A. The depicted portion of the CB trench-MOSFET device 10 is similar to the previously explained portions of the CB trench-MOSFET device 10, and thus it should be understood that previous descriptions from above may be relied upon when appropriate. Of particular note, FIG. 4 illustrates an end of the gate 26 in the overhead area 56A. This perspective cross-sectional view highlights how, at the end of one of the trench features 28, the body region 71 and overhead area 56A continue to run perpendicular to the trench features 28. Moreover, this perspective cross-sectional view emphasizes how the CB bus regions (e.g., CB bus region 70) may be formed in the active area 58 or in the overhead areas 56 of the device array 52 of FIG. 2.

Figure 5:
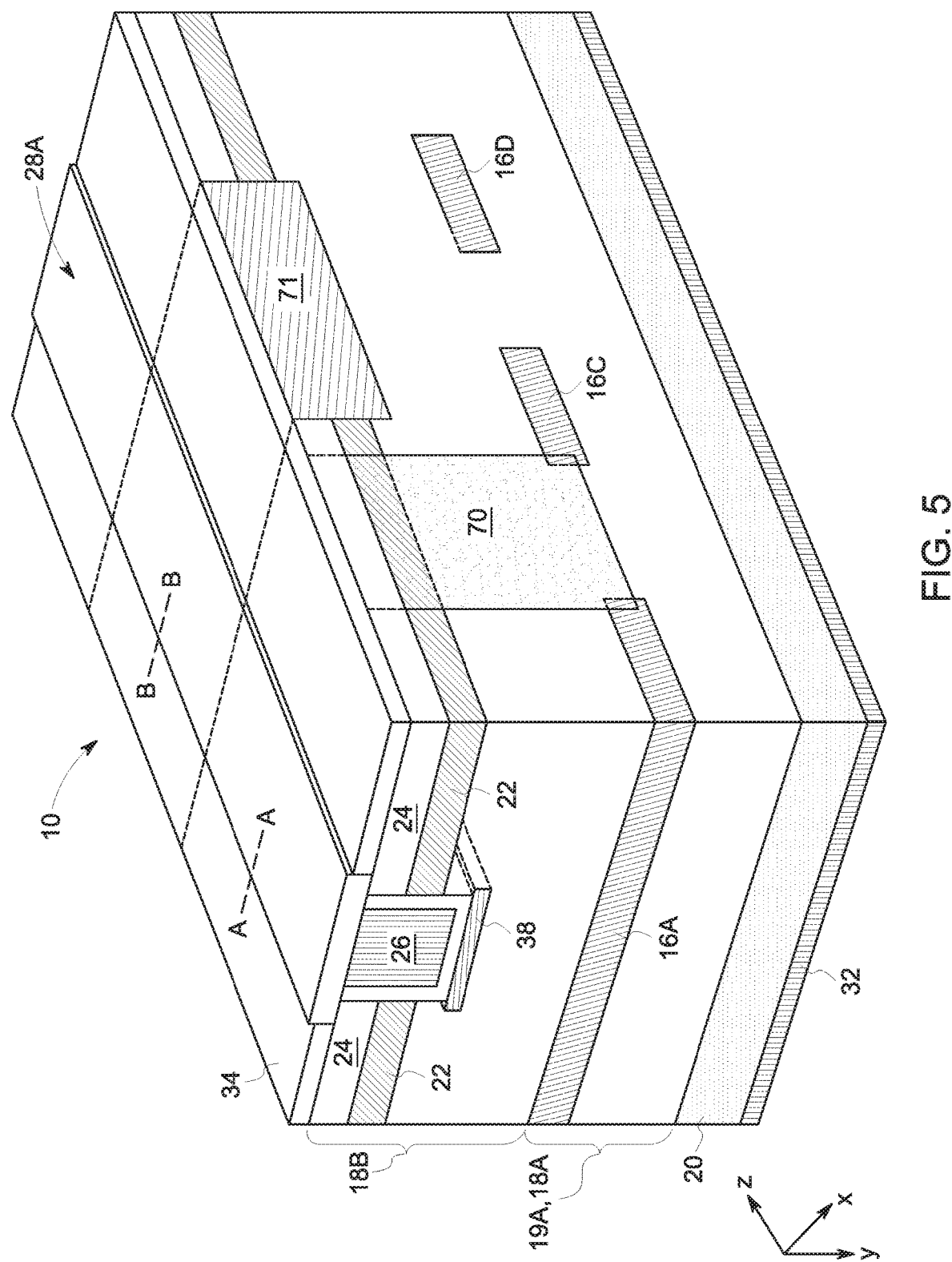
FIG. 5 is a perspective cross-sectional view of an embodiment of the CB trench-MOSFET device of FIG. 1, in accordance with embodiments of the present approach.

In yet another embodiment, FIG. 5 is a perspective cross-sectional view of another embodiment of the CB trench-MOSFET device 10. This arrangement further illustrates another potential placement for CB bus regions. An ohmic connection (e.g., ohmic contact) is made through the source contact 34 and the base region 22 onto the CB bus regions (e.g., CB bus region 70) to access the CB regions 16 (e.g., CB region 16A, CB region 16B) to be used in addition or in alternate to the designs set forth above. It should be noted that although the CB bus region 70 is shown as extending into the source region 24, the heavy doping of the source region 24 swamps (e.g., cancels out, compensates) any potential doping from the high-energy ion implantation based at least in part on the doping from the high-energy ion implantation being of sufficiently low dopant concentrations to permit the swamping, hence the dotted line depiction in FIG. 5. As depicted, this CB bus region 70 path may be more resistive of a path when compared to the path of the CB bus region 70 depicted in the other embodiments (e.g., coupling the CB region 16 to the body region 71 directly) but increases design flexibility (e.g., decreases constraints) by removing a constraint that the body region 71 be long enough to accommodate any dimensional constraints of the high-energy ion implantation procedure.

Figure 6A:
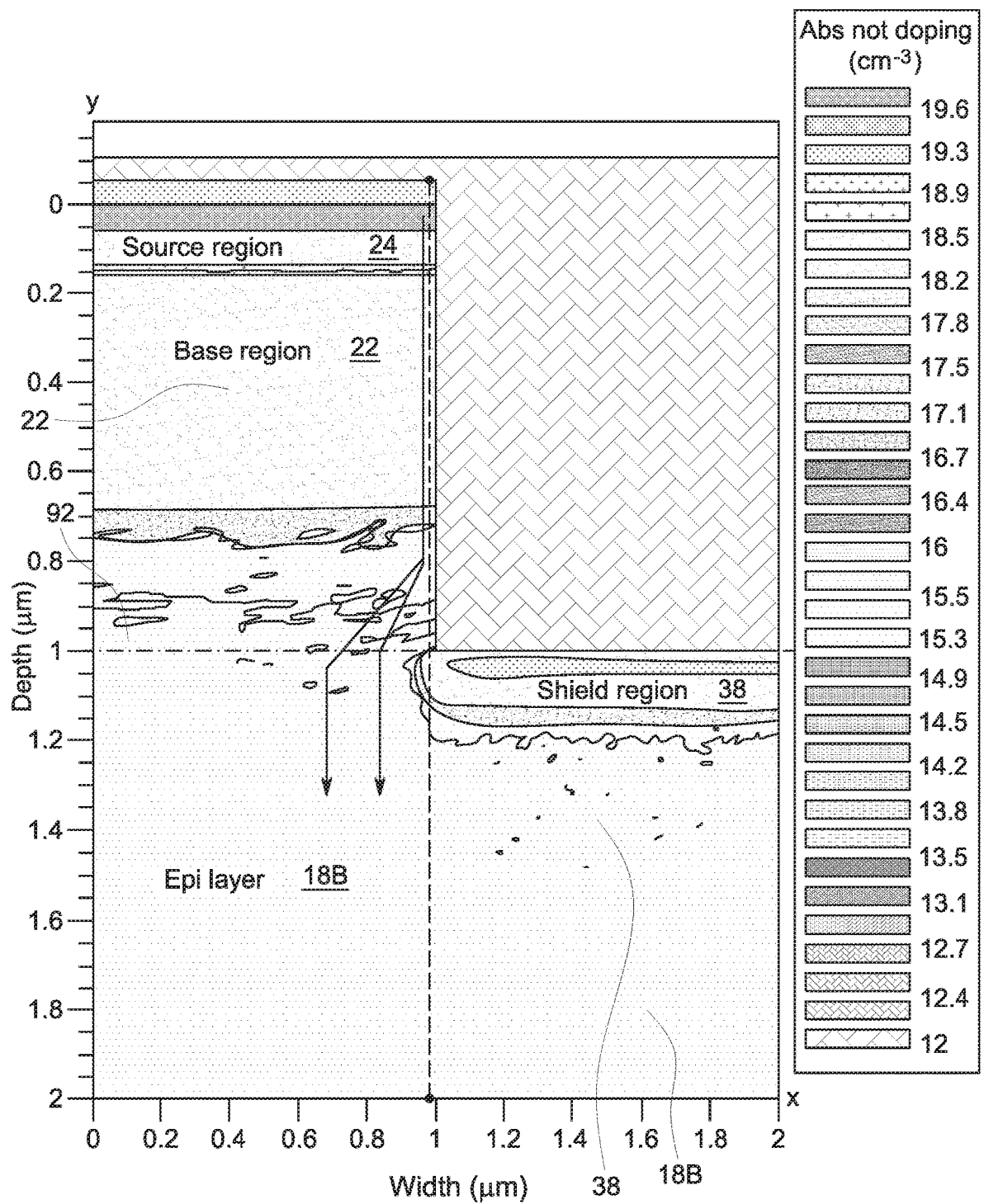
FIG. 6A is a graph indicating doping concentrations along a first cross-section associated with a simulation of the CB trench-MOSFET of FIG. 5, in accordance with embodiments of the present approach.

FIG. 6A is a graph of simulated doping concentrations associated with a first cross-section of line A-A of the embodiment of the CB trench-MOSFET device 10 of FIG. 5. The graph illustrates the source region 24 as having a higher dopant ion concentration than the epi layer (e.g., epi layer 18B) and the base region 22, which generally has a similar dopant ion concentration to the shield region 38. An epi doping region separates the shield region 38 from the base region 22 causing the shield region 38 to be electrically separate from the base region 22. This electrical separation is shown in the region around the width of 1 µm, indicated by line 92.

Figure 6B:
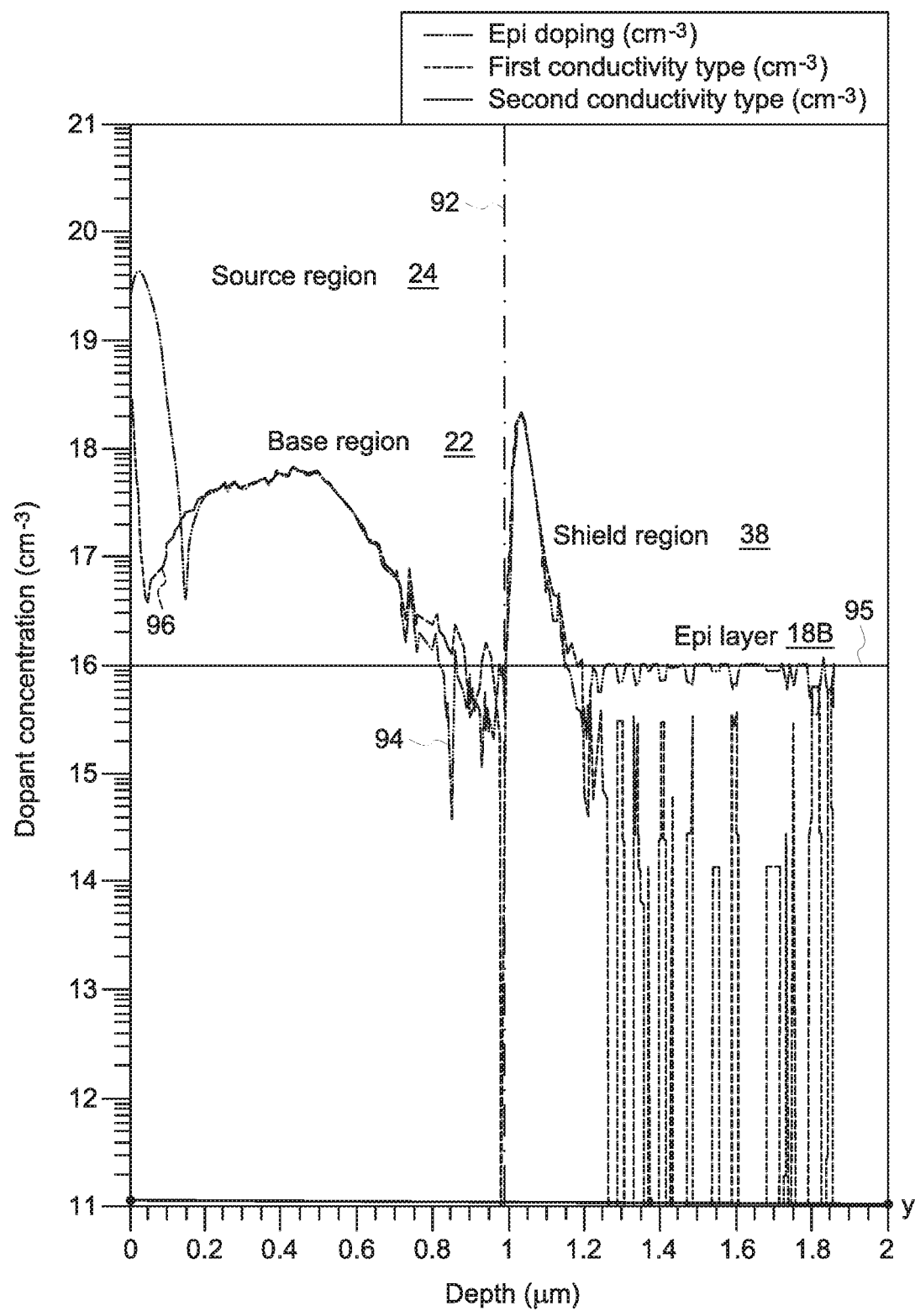
FIG. 6B is a graph indicating doping concentrations along the first cross-section associated with a simulation of the CB trench-MOSFET of FIG. 5, in accordance with embodiments of the present approach.

For a clearer depiction of the dopant ion concentrations at varying depths along the width of 1.0 µm (e.g., line 93), FIG. 6B is a graph showing simulated dopant ion concentrations at varying depths of the CB trench-MOSFET device 10 of FIG. 5 at the width of 1.0 µm indicated in FIG. 6A. The absolute net doping, represented by line 94, corresponds to the concentrations depicted in FIG. 6A and doping concentrations corresponding to the second conductivity type are represented by line 95. Looking at the graph of FIG. 6B, the absolute net dopant ion concentration having the first conductivity type (e.g., phosphorus) is greater in the source region 24 than in the epi layers 18. Doping concentrations having the first conductivity type are represented by line 96. The depth that corresponds to the region where the shield region 38 and the base region 22 is identified by the line 92 and occurs at a depth of 1 µm. Here, the base region 22 and the shield region 38 are separated by a portion of the epi layer 18A that is only epi doped. Thus, the base region 22 and the shield region 38 are electrically separated by a portion of the epi layer 18A that has a dopant ion concentration equal, or substantially similar, to the epi doping.

Figure 7A:
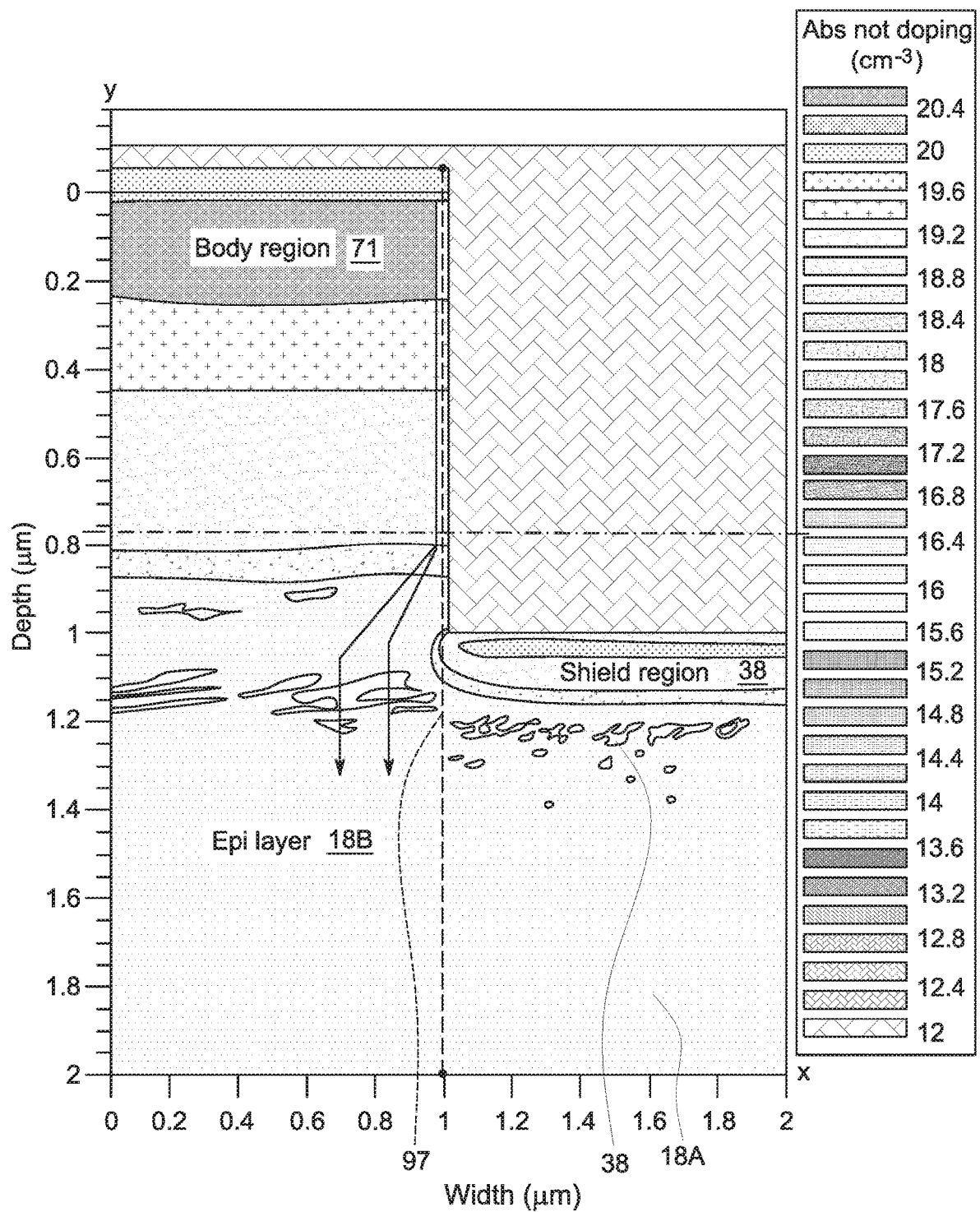
FIG. 7A is a graph indicating doping concentrations along a second cross-section associated with a simulation of the CB trench-MOSFET of FIG. 5, in accordance with embodiments of the present approach.

FIG. 7A is a graph of simulated doping concentrations along a second cross-section of line B-B for an embodiment of the CB trench-MOSFET device 10 of FIG. 5. As depicted, the body region 71 may electrically couple to the shield region 38. In this way, the various CB regions 16 (not included on the graph) are able to be electrically coupled to each of the other regions, including the shield region 38, having the second conductivity type. As such, the CB regions 16 and the shield region 38 are not considered floating.

Figure 7B:
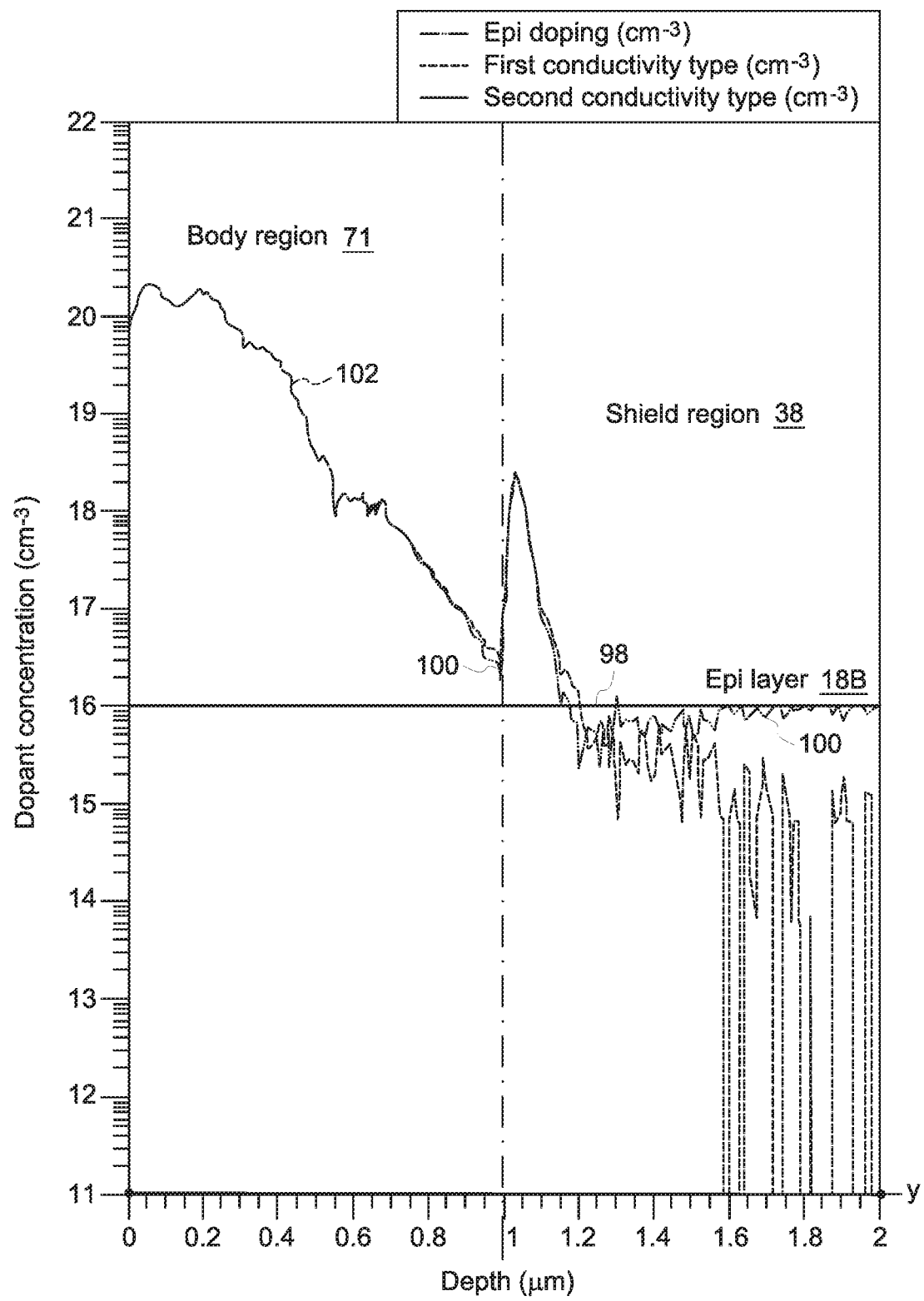
FIG. 7B is a graph indicating doping concentrations along the second cross-section associated with a simulation of the CB trench-MOSFET of FIG. 5, in accordance with embodiments of the present approach.

To better explain the electrical coupling, FIG. 7B is a graph showing simulated dopant ion concentrations of the CB trench-MOSFET device 10 the width of 1.0 µm along the line 97 of FIG. 7A. Similar to FIG. 6B, concentrations of epi doping (e.g., second conductivity type), represented by the line 98, are substantially constant. Absolute net dopant ion concentrations (e.g., line 100) and dopant ion concentrations having the first conductivity type (e.g., phosphorus, line 102) vary within the depth of the CB trench-MOSFET device 10. Furthermore, the concentrations of the first conductivity type do not decrease to the concentration of epi doping between the body region 71 and the shield region 38. Thus, the dopant ion concentrations found in the body region 71 and the shield region 38 are contiguous and not punctuated by regions of epi doping. As may be appreciated, the body region 71 and the shield region 38 are electrically coupled, and thus the shield region 38 is not a floating feature.

Figure 8:
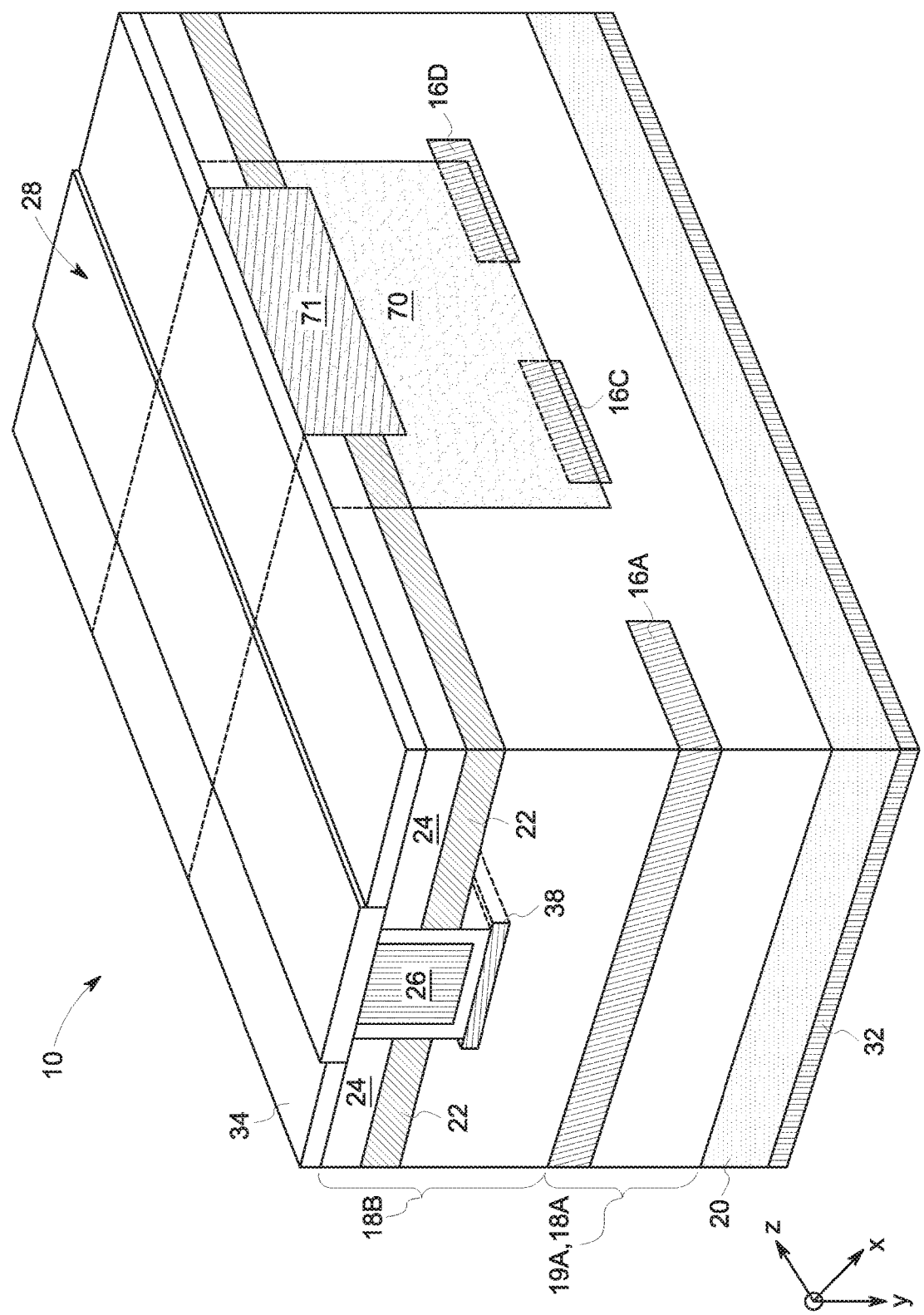
FIG. 8 is a perspective cross-sectional view of another embodiment of the CB trench-MOSFET device of FIG. 1, in accordance with embodiments of the present approach.

In yet another embodiment, FIG. 8 is a perspective cross-sectional view of a portion of another embodiment of the CB trench-MOSFET device 10. This arrangement further illustrates an additional or alternative placement option for a CB bus region. In this example, the CB bus region 70 electrically couples the body region 71 to the CB regions 16 through a portion that is longer than the body region 71, permitting greater alignment tolerances. The ohmic connection from source contact 34 is made from the base region 22 to the body region 71 or directly from the body region 71 to the CB region 16.

Figure 9:
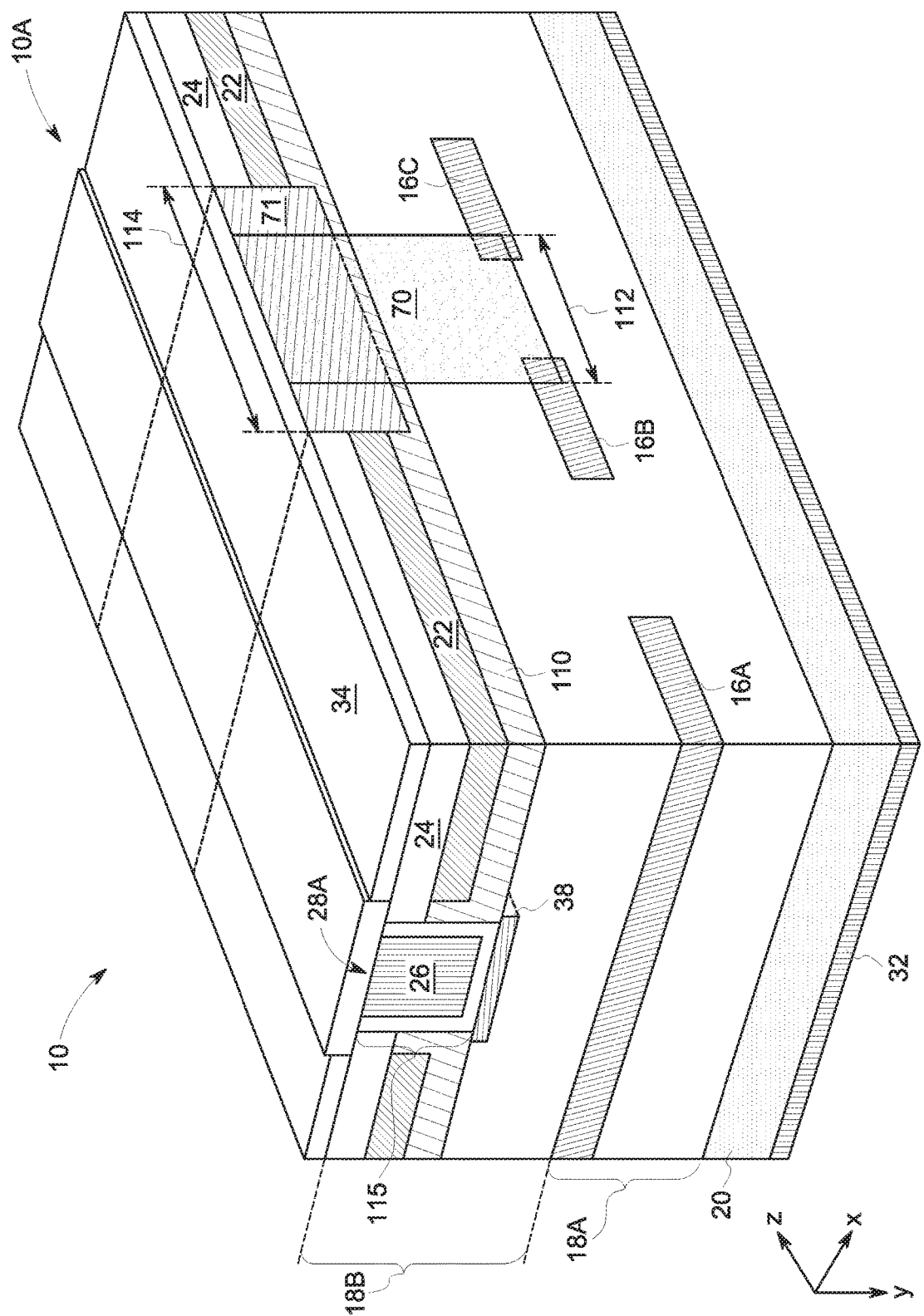
FIG. 9 is a perspective cross-sectional view of another embodiment of the CB trench-MOSFET device of FIG. 1, in accordance with embodiments of the present approach.

The CB trench-MOSFET devices 10 described above operate as an inversion mode trench-MOSFET semiconductor power device. FIG. 9 is a perspective view of another embodiment of the CB trench-MOSFET device 10 that operates in an accumulation mode. The CB trench-MOSFET device 10 illustrated in FIG. 9 also features CB regions 16 (e.g., CB region 16A, CB region 16B, CB region 16C) and the shield region 38 (e.g., a non-floating shield region as shown with discussions in FIG. 6 and FIG. 7). This embodiment includes two base regions. That is, the CB trench-MOSFET device 10E includes the base region 22 of the second conductivity type in addition to a base region 110 of the first conductivity type. The base region 110 may be lightly doped and may be formed between the base region 22 of the second conductivity type and a trench feature 28A sidewall to create a normally-off device. The base region 110 may be created through lateral epi regrowth on the trench feature 28 sidewalls of tilted implants. The CB trench-MOSFET device 10 includes a CB bus region 70 with a length 112 less than a length 114 of the body region 71.

When the gate 26 of the CB trench-MOSFET device 10 is biased with a positive voltage (e.g., positive gate voltage), an accumulation layer forms a conductive path between the source region 24 and the drain contact 32. When the gate 26 bias is zero, the base region 110 is depleted and the CB trench-MOSFET device 10 is off. The electron transport is through an accumulation mobility, which is larger than the inversion mobility of other embodiments. Through this arrangement, a channel region 115 contribution to the drain-source on resistance (Rds(on)) is reduced. It is noted that implanting CB bus regions compensates for (e.g., cancels out) the base region 110 of the first conductivity type, thereby permitting the electrical coupling to the CB regions 16. Similar to previous embodiments, the CB bus region 70 also features an ohmic connection from the source contact 34 to CB region 16B and CB region 16A of the second conductivity type, permitting the electrical coupling back to the CB regions 16) and to the body region 71.

For example, in an embodiment, the base region 110 of the CB trench-MOSFET device 10A may be approximately 0.2 μm thick (e.g., along Y-axis) and have a dopant ion concentration of approximately $1 \times 10^{16}$ cm$^{-3}$ to $2 \times 10^{16}$ cm$^{-3}$. The oxide 30 may be approximately 0.05 μm thick (e.g., along Y-axis). In addition, at a doping concentration of $1 \times 10^{16}$ cm$^{-3}$, the resulting threshold voltage for the described embodiment may range from as low as 2.5 volts to as high as 3.0 volts.

Figure 10:
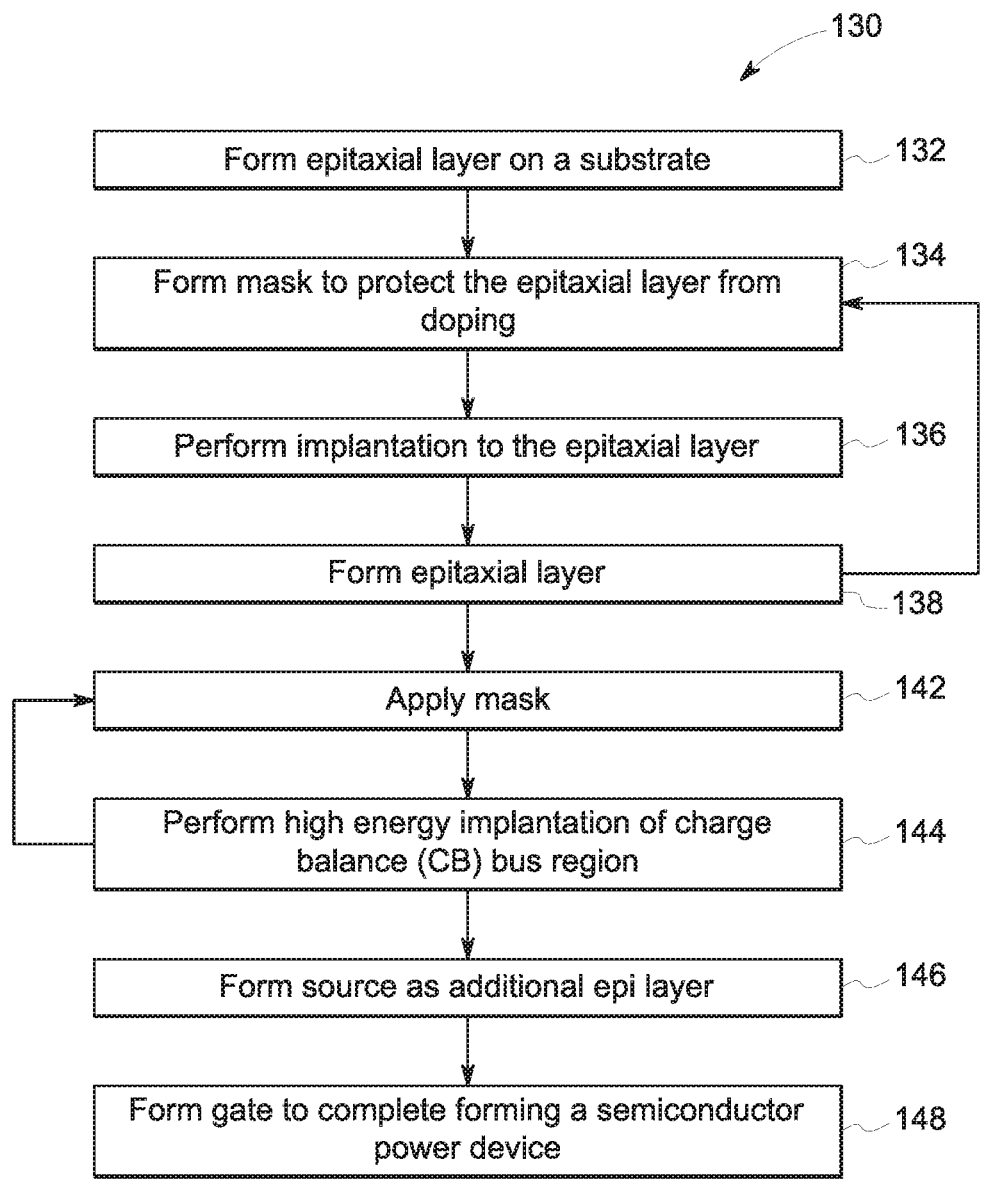
FIG. 10 is a flow diagram of a process for forming a semiconductor power device using an embodiment of the CB trench-MOSFET device of FIG. 1, in accordance with embodiments of the present approach.

FIG. 10 is a flow diagram of a process 130 for forming a CB trench-MOSFET device 10 (e.g., CB trench-MOSFET device 10 of FIG. 1) having CB bus regions implanted using a high-energy blocking mask during a high-energy implantation process. It should be noted that the illustrated embodiment of the process 130 is merely provided as an example, and in other embodiments, the process 130 may include additional steps, repeated steps, or fewer steps, in accordance with the present disclosure. Additionally, FIG. 10 is discussed with reference to features described above, for example, features of the CB trench-MOSFET device 10.

For the illustrated embodiment, the process 130 begins with forming (block 132) an epi layer (e.g., epi layer 18A) on a substrate 20. In certain embodiments, vapor-phase, liquid-phase, or solid-phase epitaxial growth techniques can be used to grow the epi layers 18. For example, the epi layer may be grown on top of an underlying layer (e.g., a SiC substrate layer, another SiC epi layer) using chemical vapor deposition (CVD) techniques in an epitaxial growth chamber.

The process 130 continues with applying (block 134) a blocking mask directly on the epi layer (e.g., epi layer 18A) formed in block 132 of a suitable material (e.g., high energy blocking mask material or low energy blocking mask material). The blocking mask may have apertures defined within the masking material for revealing areas of the epi layers 18 that are to be doped or implanted using high energy implantation techniques and/or low energy implantation techniques. These first apertures of the epi layers 18 may be of any suitable size.

After the blocking mask is formed, the process 130 continues with doping (block 136) a portion of the epi layers 18 using an ion implantation to form implantation regions of a second conductivity type. Dopant atoms that undergo ionization to become dopant ions are accelerated toward the epi surface that is partially covered with the blocking mask. Although the mask blocks many of the ions, the ions that travel through lithography apertures defined in the blocking mask (e.g., negative space, holes, unmasked regions, openings) into the epi layers 18 cause doping of a local, unmasked area of the epi layers 18 to form implanted regions, like the CB regions 16 and/or regions of the device layer 14 (e.g., source region 24, well, base region 22, shield region 38, or the like). These implanted regions have dimensions (e.g., width, length) approximately equal to the dimensions of apertures defined within the blocking mask. This implantation and masking process may be repeated as many times as desired to create a particular dopant ion concentration pattern within the epitaxial layer.

The process 130 continues with forming a second epi layer (e.g., to be used as a device layer 14) (block 138) directly on the first epi layer (e.g., epi layer 18A) and determining whether an additional epi layer is desired to be formed. If an additional epi layer is to be formed, the process 130 continues (block 134) to form the additional epi layer directly on the second epi layer. In this way, a semiconductor device having multiple epi layers 18 and one or more regions of dopant ion concentrations may be formed.

If an additional epi layer is not to be formed, the process 130 continues with applying (block 142) a high-energy blocking mask directly on a top surface of the epi layers 18 (e.g., directly on an upper surface of the device layer 14) of the CB trench-MOSFET device 10 to facilitate deep implantation of features, such as the CB bus region 70. For example, the high-energy blocking power or high-energy blocking mask (e.g., silicon on insulator (SOI), high-Z metals such as platinum, molybdenum, gold) is used. In particular, the high-energy blocking mask may be placed directly on the upper surface of the epi layers 18 (e.g., on an upper surface of the device layer 14) after epitaxial growth, and the apertures of the high-energy blocking mask reveal areas for one or more CB bus regions while the high-energy blocking mask covers the remainder of the upper surface of the epi layers 18. The high-energy blocking mask may be of any suitable material of sufficient thickness to block energy ranges of high-energy ion implantation equipment, for example, implanters that use 500 KeV or more.

After the high-energy blocking mask is added to the upper surface of the epi layers 18, the process 130 continues with performing (block 144) a high-energy implantation to implant epi layers 18 with dopant ions to form the CB bus regions. After implantation, areas that were exposed by the high-energy blocking mask of the epi layers 18 (e.g., via apertures of the high-energy blocking mask) are implanted deeply with the desired dopant ion concentration. In addition, after high-energy implantation concludes, the high-energy blocking mask is removed before manufacturing of the CB trench-MOSFET device 10 continues. In some embodiments, the high-energy implantation is repeated, for example, to form high-energy implanted regions of opposite conductivity type relative to the first high-energy implantation. Furthermore, in some embodiments, certain features of the device layer 14 (e.g., a source region 24) may be implanted after the high-energy implantation.

The process 130 continues with forming (block 146) a source contact 34 and a drain contact 32 directly on the upper and lower surfaces of the CB trench-MOSFET device 10. The source contact 34 is formed directly on the upper surface of the epi layers 18, similar to where the blocking mask was formed. Any suitable method of formation may be followed to form the source contact 34 directly on the top epi layer (e.g., epi layer 18B). For example, metallization or CVD may be used to form the source contact 34. The drain contact 32 is formed on the bottom of the substrate 20. Similar to the source contact 34, the drain contact 32 may be formed through a variety of suitable metallization techniques, including CVD or sputtering.

The process 130 continues with forming (block 148) a gate 26 within the device layer 14. The gate 26 may be formed before or after the source contact 34 and/or the drain contact 32 are formed, depending on the specific embodiment. Forming the gate 26 may involve a masking and etching process to form a trench feature (e.g., trench feature 28A) and an oxide 30 within the trench feature. The gate 26 is fabricated by depositing polysilicon or another suitable conductive material. After forming of the trench feature, various oxides and materials may be implanted, deposited, or otherwise disposed within the trench feature to complete forming the semiconductor power device (e.g., CB trench-MOSFET device 10) via additional or alternative steps to the steps described herein to reach a final device structure.

Figure 11:
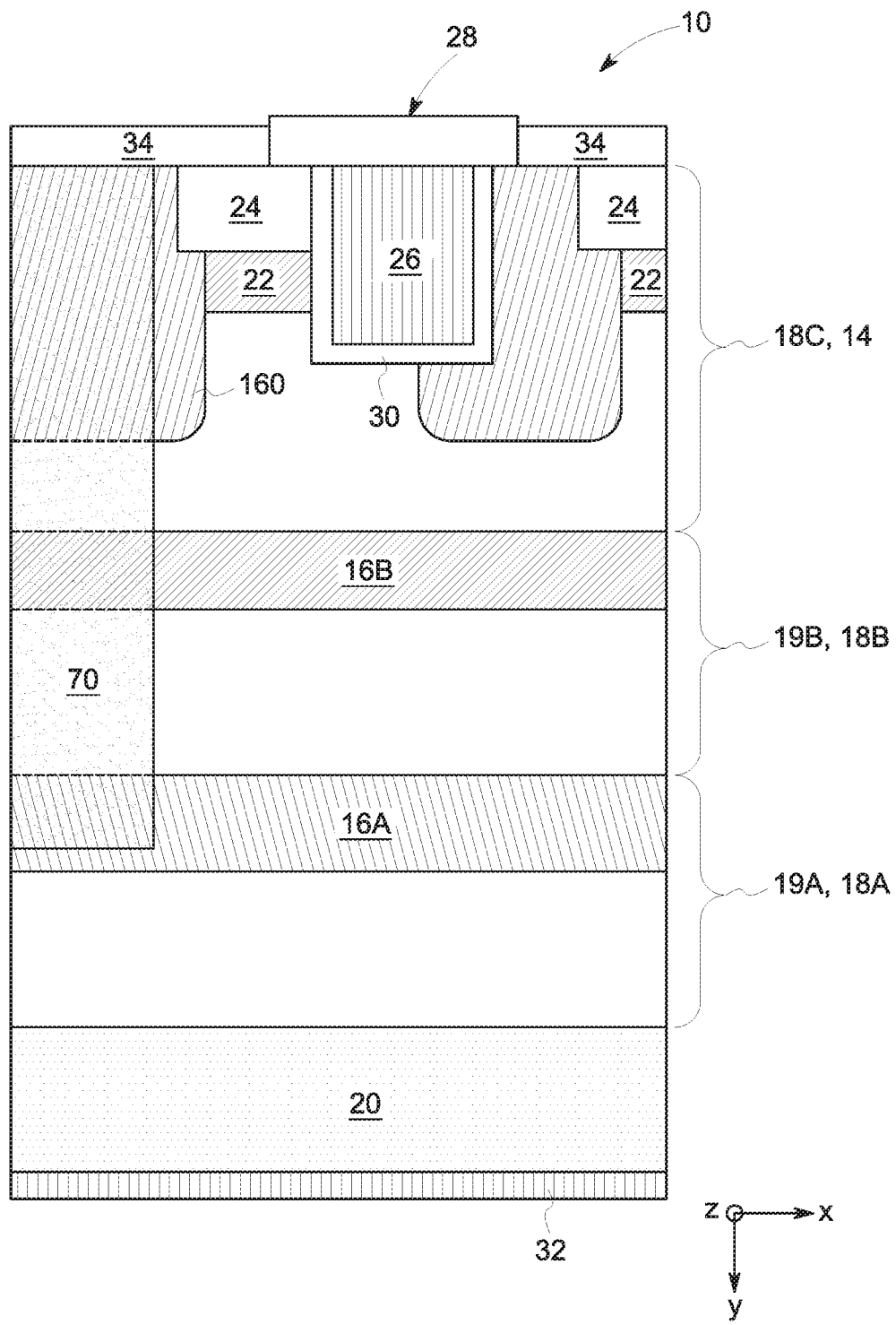
FIG. 11 is a cross-sectional view of another embodiment of the CB trench-MOSFET device of FIG. 1, in accordance with embodiments of the present approach.

Using the systems and methods described above, a variety of embodiments may be formed. As another example, FIG. 11 is a cross-sectional view of a portion of another embodiment of the CB trench-MOSFET device 10, representing an asymmetric device design. This arrangement further illustrates an additional or alternative placement option for a CB bus region and an additional or alternative arrangement of device features formed in a device layer. The CB trench-MOSFET device 10 illustrated in FIG. 11 includes shield regions 160, which may be formed using high-energy implantation techniques. The shield regions 160 protect the oxide 30 at the bottom and corners of the trench 28 from strong electric fields during device operation. In this example, an ohmic connection electrically couples the source contact 34 to the CB regions 16 through the CB bus region 70.

Figure 12:
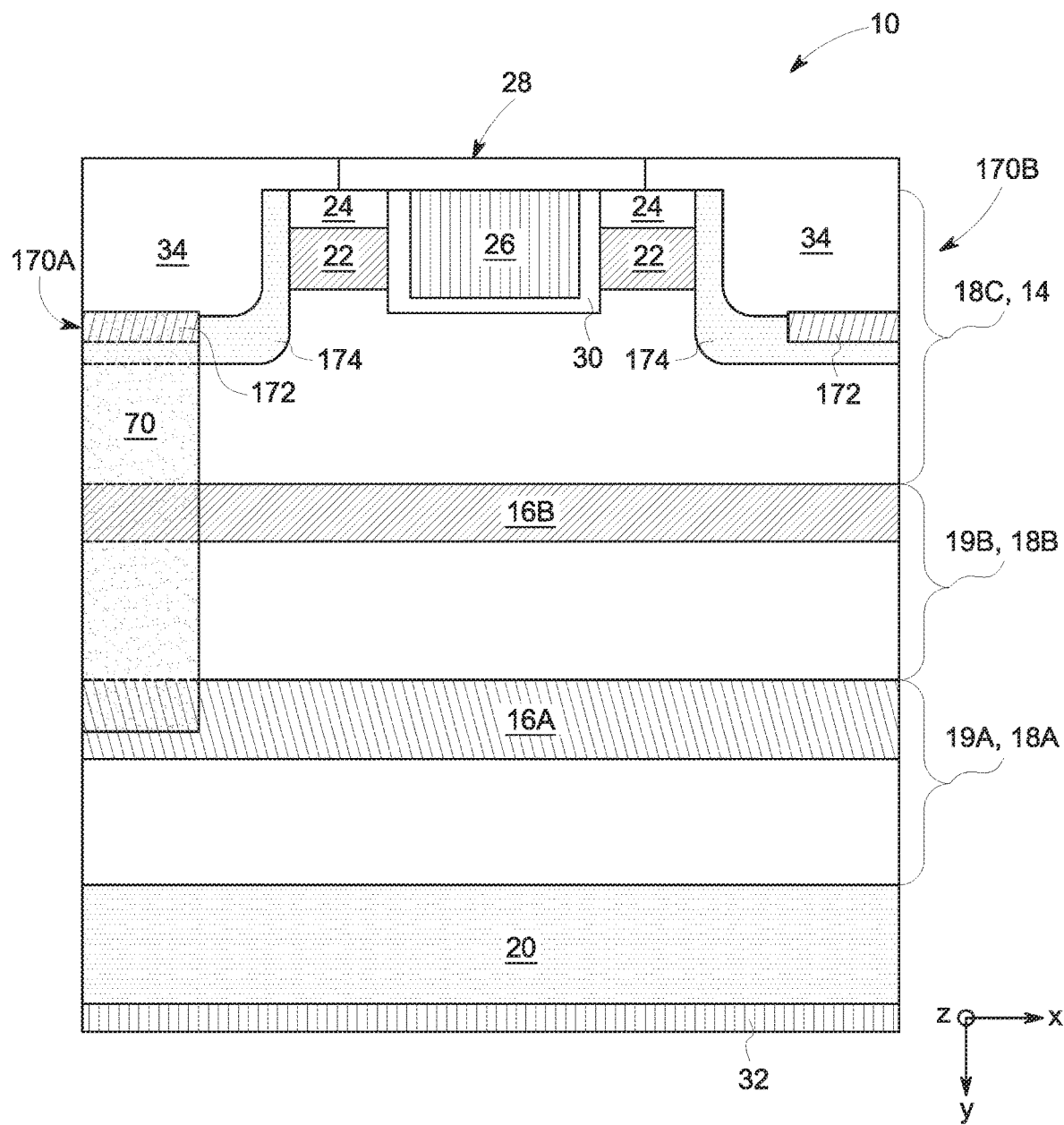
FIG. 12 is a cross-sectional view of another embodiment of the CB trench-MOSFET device of FIG. 1, in accordance with embodiments of the present approach.

In another embodiment, FIG. 12 is a cross-sectional view of a portion of another embodiment of the CB trench-MOSFET device 10. This arrangement further illustrates an additional or alternative placement option for a CB bus region and an additional or alternative arrangement of device features formed in a device layer. The CB trench-MOSFET device 10 illustrated in FIG. 12 includes shielding trenches 170 (shielding trench 170A, shielding trench 170B) positioned on either side of the trench 28 to protect the oxide 30 at the bottom and/or the corners of the trench 28 from active state electric fields. The shielding trench 170A and the shielding trench 170B both include a trench formation, the source contact 34, a shield region 172, and a doped sidewall region 174. The trench formation may be formed in a manner substantially similar to a method used to form the trench 28. For the illustrated embodiment, for example, before forming the source contact 34 in the trench formation, the CB bus region 70 may be implanted using high-energy implantation techniques. In this example, an ohmic connection electrically couples the source contact 34 to the CB regions 16 through the CB bus region 70.

Technical effects of this disclosure include designs and methods of manufacturing CB trench-MOSFET devices that reduce switching losses and increase switching speeds of the CB trench-MOSFET devices. In particular, the disclosed CB devices include a CB bus region that electrically couples one or more CB regions of a CB trench-MOSFET device to a doped region having the same conductivity type as the one or more CB regions, yielding an ohmic connection from the source or body contact to the CB regions. The CB bus region may be implanted using high-energy ion implantation. Accordingly, the resulting CB trench-MOSFET device may have increased switching speeds and reduced switching losses while maintaining high blocking voltages.

This written description uses examples, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A charge balanced (CB) trench-metal-oxide-semiconductor field-effect transistor (MOSFET) device, comprising:
   a charge balanced (CB) layer defined within a first epitaxial (epi) layer and having a first conductivity type, wherein the CB layer includes a plurality of charge balanced (CB) regions having a second conductivity type;
   a device layer defined in a second epi layer and having the first conductivity type disposed on the CB layer, wherein the device layer includes:
      a source region having the first conductivity type disposed at an upper surface of the second epi layer;
      a base region having the second conductivity type disposed below the source region;
      a body region having the second conductivity type that extends from the upper surface of the second epi layer, through the source region, and into the base region;
      a trench feature that extends from the upper surface of the second epi layer, through the source region and the base region, to a depth below the base region; and a shield region having the second conductivity type at least partially disposed at a bottom surface of the trench feature;

a source contact disposed directly on the source region and the body region at the upper surface of the device layer; and a charge balanced (CB) bus region having the second conductivity type that extends between the plurality of CB regions of the CB layer and electrically couples the plurality of CB regions to the source contact via the base region and the body region.

2. The CB trench-MOSFET device of claim 1, wherein the CB bus region electrically couples to the plurality of CB regions through an ohmic contact from a portion of the source contact that is disposed directly on the body region.

3. The CB trench-MOSFET device of claim 1, wherein the shield region has a width that is greater than a width of the trench feature, and wherein the depth of the trench feature is greater than the width of the trench feature.

4. The CB trench-MOSFET device of claim 1, wherein a pitch associated with the CB MOS device is between 2.5 micrometers (μm) and 4 μm, and wherein the trench feature has a width ranging from 1 μm and 1.5 μm.

5. The CB trench-MOSFET device of claim 1, wherein the base region is disposed in an active area of the CB MOS device.

6. The CB trench-MOSFET device of claim 1, wherein the CB bus region comprises a first implantation region substantially aligned with a second implantation region.

7. The CB trench-MOSFET device of claim 1, comprising an enhanced doping region having the first conductivity type disposed below the base region, wherein the enhanced doping region has a greater dopant concentration than a remainder of the second epi layer.

8. The CB trench-MOSFET device of claim 1, wherein the CB bus region extends between and electrically couples the plurality of CB regions to a body region in an active area of the CB trench-MOSFET device.

9. The CB trench-MOSFET device of claim 1, wherein the CB bus region is formed in an overhead area of the CB trench-MOSFET device and electrically coupled to a body region also formed in the overhead area of the CB trench-MOSFET device.

10. The CB trench-MOSFET device of claim 1, wherein the first conductivity type is created from p-type dopants.

11. The CB trench-MOSFET device of claim 1, comprising an additional trench feature.

12. The CB trench-MOSFET device of claim 1, wherein the shield region is only partially disposed under the trench feature.

13. The CB trench-MOSFET device of claim 1, wherein the base region is completely disposed below the source region.

14. The CB trench-MOSFET device of claim 1, wherein the body region extends below the base region within the second epi layer.

15. The CB trench-MOSFET device of claim 1, wherein the plurality of CB regions are electrically coupled to the body region, the base region, and the shield region.

16. The CB trench-MOSFET device of claim 1, wherein the shield region and the base region are electrically separated by a portion of the second epi layer.

17. The CB trench-MOSFET device of claim 1, wherein the source region has a higher dopant concentration than a remainder of the second epi layer.

18. A system, comprising:
an active area comprising:
a charge balanced (CB) trench-metal-oxide-semiconductor field-effect transistor (MOSFET) device comprising:
a charge balanced (CB) layer defined within a first epitaxial (epi) layer and having a first conductivity type, wherein the CB layer includes a plurality of charge balanced (CB) regions having a second conductivity type; and
a device layer defined in a second epi layer disposed on the CB layer, wherein the device layer includes:
a source region having the first conductivity type disposed at an upper surface of the second epi layer ;
a base region having the second conductivity type disposed below the source region; and
a body region having the second conductivity type that extends from the upper surface of the second epi layer, through the source region, and into the base region; and
a source contact disposed directly on the source region and the body region at the upper surface of the device layer;
an overhead area having the second conductivity type disposed adjacent to the active area; and
a charge balanced (CB) bus region having the second conductivity type that extends between the first epi layer and the second epi layer and electrically couples the plurality of CB regions of the CB layer to the source contact via the base region of the device layer and the body region of the device layer , wherein the CB bus region is disposed within the active area, the overhead area, or a combination thereof.

19. The system of claim 18, wherein the device layer includes:
a trench feature that extends from the upper surface of the second epi layer to a depth below the base region and including a gate, wherein the gate is disposed entirely within the trench feature; and
a shield region having the second conductivity type disposed at a bottom surface of the trench feature.

20. The system of claim 18, wherein the second conductivity type is created from an implantation using p-type dopants.

21. The system of claim 18, wherein the CB trench-MOSFET device comprises a shield region disposed in the active area.

* * * * *